(12) United States Patent
Malshe et al.

(10) Patent No.: US 6,607,782 B1
(45) Date of Patent: Aug. 19, 2003

(54) METHODS OF MAKING AND USING CUBIC BORON NITRIDE COMPOSITION, COATING AND ARTICLES MADE THEREFROM

(75) Inventors: Ajay P. Malshe, Fayetteville, AR (US); Sharad N. Yedave, College Park, MD (US); William D. Brown, Fayetteville, AR (US); William C. Russell, Bloomfield, MI (US); Deepak G. Bhat, Antioch, TN (US)

(73) Assignees: Board of Trustees of the University of Arkansas, Little Rock, AR (US); Valenite, Inc., Madison Heights, MI (US)

( * ) Notice: Subject to any disclaimer, the term of this patent is extended or adjusted under 35 U.S.C. 154(b) by 0 days.

(21) Appl. No.: 09/607,021

(22) Filed: Jun. 29, 2000

(51) Int. Cl.⁷ .................................................. B05D 3/10
(52) U.S. Cl. ........................ 427/189; 427/450; 427/452; 427/249.2; 427/900
(58) Field of Search ................................. 427/450, 452, 427/455, 249.1, 249.2, 249.4, 900, 189

(56) References Cited

U.S. PATENT DOCUMENTS

| | | | | |
|---|---|---|---|---|
| 4,745,010 A | * | 5/1988 | Sarin et al. | 427/255.7 |
| 5,273,790 A | * | 12/1993 | Herb et al. | 427/577 |
| 5,286,565 A | * | 2/1994 | Holzl et al. | 427/255.29 |
| 5,330,854 A | * | 7/1994 | Singh et al. | 427/387 |
| 5,441,762 A | * | 8/1995 | Gray et al. | 427/190 |
| 5,534,808 A | * | 7/1996 | Takaki et al. | 327/261 |
| 5,614,140 A | * | 3/1997 | Pinneo | 427/585 |
| 5,677,060 A | * | 10/1997 | Terentieva et al. | 427/397.7 |
| 5,902,671 A | * | 5/1999 | Kutscher | 427/255.7 |
| 5,945,166 A | * | 8/1999 | Singh et al. | 427/387 |
| 6,258,237 B1 | | 7/2001 | Gal-Or et al. | |
| 6,410,086 B1 | | 6/2002 | Brandon et al. | |

* cited by examiner

Primary Examiner—Bret Chen
(74) Attorney, Agent, or Firm—Gilbreth & Associates, P.C.; J. M. (Mark) Gilbreth; Mary A. Gilbreth

(57) ABSTRACT

Methods for coating a substrate and methods of shaping a workpiece comprise formation and use, respectively, of a surface or substrate comprising a first phase selected from nitrides, carbides. carbonitrides, borides, sulphides, chalcogenides, oxides, and silicides, and a second phase selected from nitrides, carbides, carbonitrides, borides, sulphides, chalcogenides, oxides, and silicides, wherein said second phase comprises a multiplicity of discrete portions positioned into the first phase, with these multiplicity of portions comprising a continuous second phase, and made thereof, coating and articles, especially machining, cutting and shaping tools, wearparts, and methods of making and using the composition, coating and articles.

14 Claims, 8 Drawing Sheets

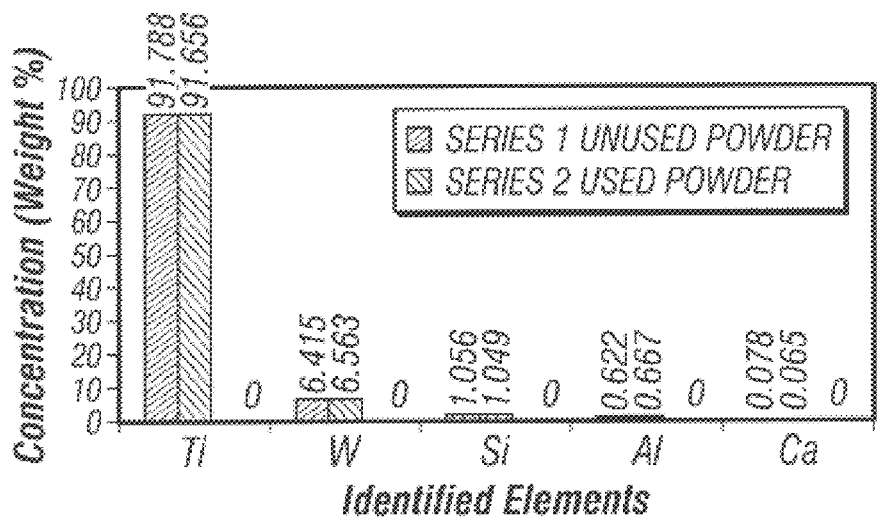
FIG. 3
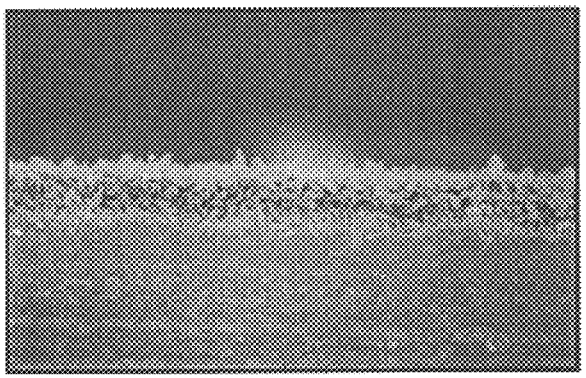
x1.0k 0059 15kV 50μm
FIG. 4A
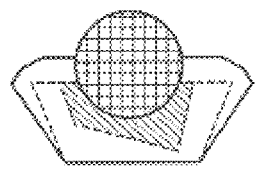
FIG. 4B
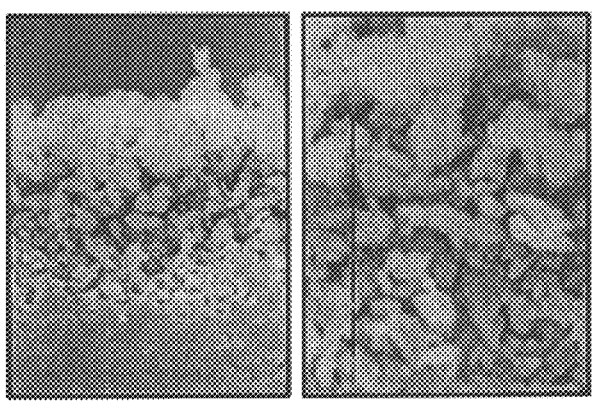
0060 15kV 10μm   0061 15kV 5μm
FIG. 5A           FIG. 5B
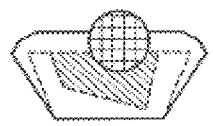 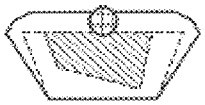
FIG. 5C      FIG. 5D

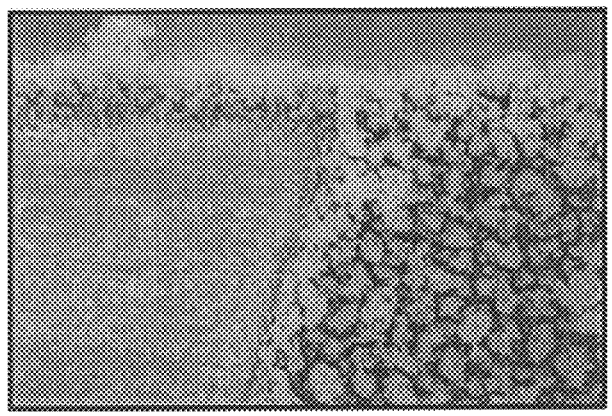
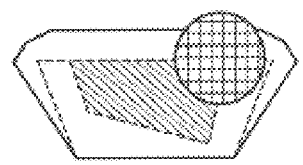
FIG. 6A
FIG. 6B
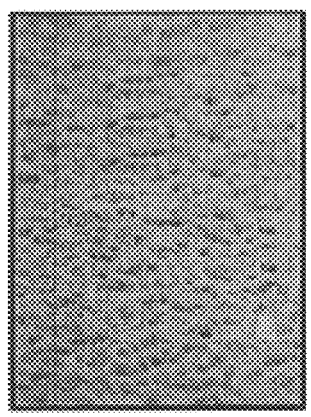
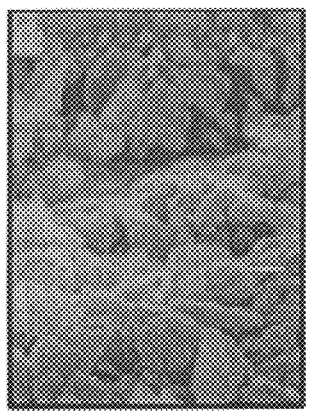
FIG. 7A
FIG. 7B
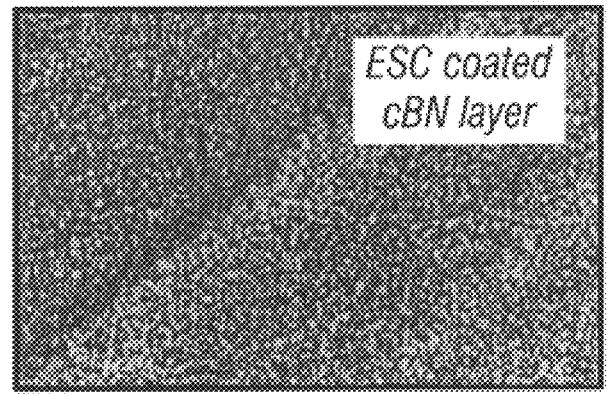
FIG. 8

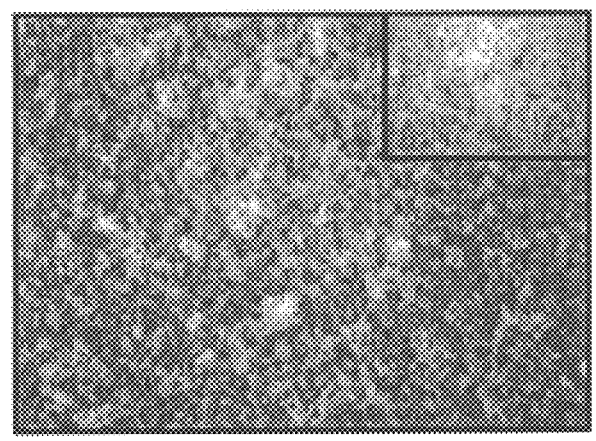
*FIG. 18B*
*FIG. 18A*
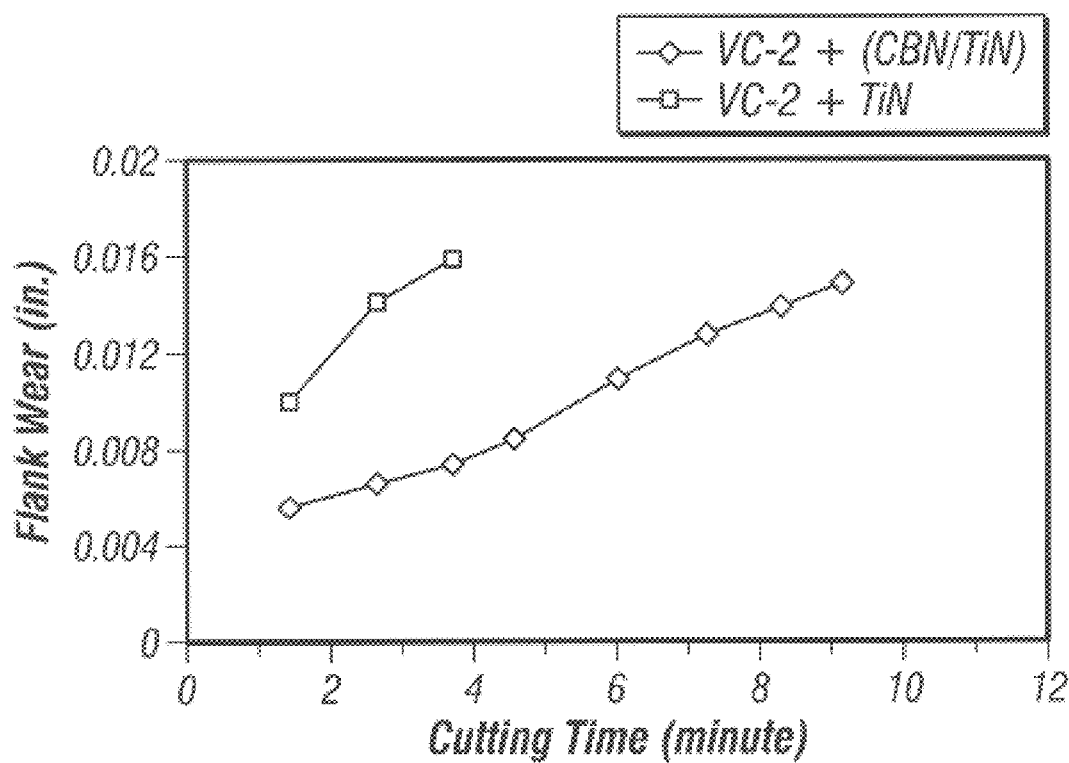
*FIG. 19*

METHODS OF MAKING AND USING CUBIC BORON NITRIDE COMPOSITION, COATING AND ARTICLES MADE THEREFROM

BACKGROUND OF THE INVENTION

1. Field of the Invention

The present invention relates to compositions, to coatings and articles made from such compositions, and to methods of making and using such compositions, coatings and articles. In another aspect, the present invention relates to nitride, carbide, carbonitride, boride, sulphide, chalcogenide, and silicide compositions, to coatings and articles made from such compositions, and to methods of making and using such compositions, coatings and articles. In even another aspect, the present invention relates to compositions of nitrides, carbides, carbonitrides, borides, sulphides, chalcogenides, and silicides, also having present one or more of nitrides, carbides, carbonitrides, borides, or silicides, to coatings and articles made from such compositions, and to methods of making and using such compositions, coatings and articles. In still another aspect, the present invention relates to cubic boron nitride compositions, to coatings and articles made from such cubic boron nitride compositions, and to methods of making and using such compositions, coatings and articles. In yet another aspect, the present invention relates to compositions of cubic boron nitride having present one or more of nitrides, carbides, carbonitrides, borides, sulphides, chalcogenides, and silicides, to coatings and articles, especially tools and cutting tools, made from such compositions, and to methods of making and using such compositions, coatings and articles.

2. Description of the Related Art

The development of harder materials has created the nee for both processing techniques, and tools with a work surface capable of shaping and cutting workpieces mad of such hard materials.

For example, in recent years grinding has gained its significance as a stock removal process for shaping and sizing both hard and soft materials in contrast to what was realized in the past as a metal finishing operation an a process to be worked on very hard materials. Cutting tools have been pushed into more and more applications in which harder materials are cut at higher speeds, requiring the tool to be longer lasting, tougher an more wear resistant.

To meet the ever increasing demands for improved productivity in the field of grinding and metal cutting, various new techniques have been introduced and are being investigated. These processes basically are intended to provide for high rate stock removal, with improved work piece quality and prolonged grinding wheel and cutting tool life.

One of the most important requirements to be satisfied by the grinding wheels is free cutting action. This necessitates availability of large chip clearance volume ahead of individual crystals. The gap between the adjacent grit in the direction of cutting should be wide enough, and at the same time, the protrusion of the grit above the bond should be large enough to facilitate this gap clearance. Along with these conditions another requirement to be fulfilled is that the bond between grits and matrix should be strong to retain the grit throughout its useful life. The bonding material should have desirable mechanical properties like strength, hardness, good adhesion to the substrate, low solubility in the ground material, and resistance to yielding during actual grinding.

As can be expected, there have been many attempts in the prior art at providing tools having extremely hard work surfaces for cutting and/or grinding such hard workpieces.

For example, boron nitride formed under high pressure includes cubic boron nitride (hereinafter referred to as cBN) and wurtzite boron nitride (hereinafter referred to as wBN). These have the highest hardness next to diamond, and are very promising for grinding and cutting uses. For grinding, the boron nitride material has already been used broadly. For cutting, a cBN compact/bulk bonded by a metal, such as cobalt, has been developed. However, this compact of cBN bonded by a metal has, when used as a cutting tool, various defects. For example, high temperatures generated during the cutting process cause the bonding metal to soften resulting in lowered wear resistance.

High pressure form boron nitride has excellent properties such as high hardness and high heat conductivity, for use as a material for a tool. In a cutting tool, for example, if the other conditions are the same, the higher the heat conductivity of the tool material, the lower the temperature at the cutting tip, which is more advantageous from the standpoint of improving the wear resistance of the tool. In the case of intermittent cutting as in the case of milling cutter, heat shock is imparted to the tool by the rapid rise and fall of the temperature, thereby causing cracks. However, when a tool has a higher heat conductivity, i.e. transmits heat faster, resulting in a faster reduction in the temperature gradient between the temperature of the surface of the tool and temperature of the interior of the tool, resulting in lower thermal stress, and thus minimizing cracks.

cBN high pressure sintered ceramic tips/substrates generally include a small cBN part brazed or cemented to a carbide body. The disadvantages of such ceramic tips are that attachment of the tips with cementing or brazing is labor intensive, and the cement or braze is the weak point for tool failure.

In recent years the increase in the performance of cutting machines has resulted in a trend toward higher cutting speeds and heavier cutting. However, the strength of the cBN high pressure sintered ceramic tips is inadequate. This is especially true for high speed interrupted cutting of high strength steels such as case hardened steels and superalloys, or for cutting under severe conditions such as high feed interrupted cutting. Moreover, due to this lack of strength, the cutting edge of the cutting tip is susceptible to cracking and chipping resulting in unsatisfactory cutting performance.

The art is filled with numerous references directed to cubic boron nitride compositions in the bulk form, the following described patents merely being just a few.

U.S. Pat. No. 4,334,928, issued Jun. 15, 1982, to Hara, et al., discloses a sintered compact for a machining tool and a method of producing the compact. The disclosed compact comprises 10–80 volume percent of a high pressure form of boron nitride, and the balance a matrix of at least one binder compound material selected from the group consisting of a carbide, nitride, carbonitride, boride or silicide of a IVa and Va transition metal.

U.S. Pat. No. 5,129,918, issued Jul. 14, 1992, to Chattopadhay, discloses a cubic boron nitride abrasive tool. The monolayer cBN tool is fabricated by first coating cBN grit with carbides of transition metals directly by CVD to make the surface metallurgically compatible to readily and commercially available brazing alloys known for their strength and durability. This coated grit is then brazed onto a steel substrate.

U.S. Pat. No. 5,328,875, issued Jul. 12, 1994 to Ueda, et al., discloses cubic boron nitride-base sintered ceramics for a cutting tool. The ceramics composition comprises a dispersed phase of cubic crystal boron nitride a bonding phase of one or more of titanium and aluminum carbide, nitride and carbonitride compounds including oxygen, and 20% to 48% by volume of decomposed reaction phase cubic crystal boron nitride. The decomposed reaction phase comprises one or more of titanium carbide, titanium nitride and titanium carbonitride, and one or more of aluminum oxide and aluminum nitride, as well as titanium boride.

U.S. Pat. No. 5,389,118, issued Feb. 14, 1995 to Hinterman, et al., discloses a cBN abrasive tool comprising a metal, ceramic or cemented carbide substrate and a single layer of cBN grits bonded to said substrate by a brazing alloy, characterized in that the surface chemistry of said cBN grits is modified by depositing thereon a film of silicon carbide.

U.S. Pat. No. 5,466,642, issued Nov. 14, 1995, to Tajima et al., discloses a wear resistant cBN-based cutting tool which includes a specified amount of at least one of a Ti carbide/nitride component, a compound including at least one of Ti and Al, tungsten carbide, $Al_2O_3$, and the balance being cBN and incidental impurities.

U.S. Pat. No. 5,503,913, issued Apr. 2, 1996 to Konig, et al., discloses a tool with a wear-resistant cutting edge made of cubic boron nitride or polycrystalline cubic boron nitride, a method of manufacturing the tool and its use. The wear properties of tools with cutting edge of cubic boron nitride (cBN) or polycrystalline cubic boron nitride (PcBN) are improved by coating the cBN or PcBN body with a 0.5 to 6 $\mu$m thick layer of one or more oxides of the metals zirconium and/or yttrium and/or magnesium and/or titanium and/or aluminum, preferably aluminum oxide.

U.S. Pat. No. 5,766,783, issued Jun. 16, 1998 to Utsumi et al., discloses boron-containing aluminum nitride coating which is utilized for tools, abrasive-resistant parts, surface acoustic wave devices, light emitting devices, high thermal conductive heat sinks or the like.

U.S. Pat. No. 5,830,813, issued Nov. 3, 1998, to Yao, et al., discloses a polycrystalline cubic boron nitride cutting tool comprising from 50 to 85 weight percent cubic boron nitride crystals bonded together as a polycrystalline mass with a commingled supporting phase from 15 to 40 weight percent of a refractory material which is preferably titanium carbonitride or titanium aluminum carbonitride.

U.S. Pat. No. 5,834,689, issued Nov. 10, 1998 to Cook discloses a cubic boron nitride composite structure comprised of a matrix material, such as metal, and a plurality of cubic boron nitride particles dispersed within and surrounded by the matrix material. The composite structure is cited as being useful as an electronic package to house an electrical device such as an integrated chip.

U.S. Pat. No. 5,882,777, issued Mar. 16, 1999, to Kukino et al., discloses a super hard composite material for tools comprising a cBN sintered body containing more than 20% by volume of cubic boron nitride (cBN), improved in strength of base material, wear-resistance, hardness at high temperatures and acid-resistance usable in cutting work of steels which are difficult to be machined. The substrate has a laminated film consisting of super thin films (a) and (b) deposited alternatively on the substrate, the super thin film (a) being made of nitride and/or carbide of at least one element selected from a group comprising IVa group elements, Va group elements, VIa group elements, Al and B and possessing a crystal structure of cubic system and metallic bond property, the super thin film (b) being made of at least one compound possessing a crystal structure other than a cubic system and covalent bond property under equilibrium condition at ambient temperature and pressure, each unit layer of the super thin films (a) and (b) having a thickness of 0.2 nm to 20 nm, and the laminated film on the whole possessing a crystal structure of cubic system.

U.S. Pat. No. 5,897,751, issued Apr. 27, 1999, to Makowiecki et al., discloses hard coatings fabricated from boron nitride, cubic boron nitride, and multilayer boron/cubic boron nitride, fabricated by magnetron sputtering in a selected atmosphere. These hard coatings may be applied to tools and engine and other parts, as well to reduce wear on tribological surfaces and electronic devices. These boron coatings contain no morphological growth features. For example, the boron is formed in an inert (e.g. argon) atmosphere, while the cubic boron nitride is formed in a reactive (e.g. nitrogen) atmosphere. The multilayer boron/cubic boron nitride, is produced by depositing alternate layers of boron and cubic boron nitride, with the alternate layers having a thickness of 1 nanometer to 1 micrometer, and at least the interfaces of the layers may be discrete or of a blended or graded composition.

U.S. Pat. No. 5,928,771, issued Jul. 27, 1999, to DeWald et al., discloses a sputtered coating of cubic boron nitride dispersed in a matrix of disordered boron and carbon, such as boron carbide, which coating is wear resistant, adherent, lubricous, and suitable as a coating for tools, molds, and wear parts. The coating has first, second, and third regions. The first region is sputtered in an inert atmosphere onto a substrate such as tool steel and includes at least one layer of disordered boron and carbon. The second region is formed by gradually replacing the inert sputtering atmosphere with nitrogen to form cubic boron nitride crystals in a gradually increasing concentration dispersed in a matrix of disordered boron and carbon. The third region atop the second region is an outer wear layer that has a substantially uniform concentration throughout of cubic boron nitride dispersed in disordered boron and carbon.

However, in spite of these advancements in the prior art, there is still a need for compositions, coatings and articles made therefrom, and methods of making and using the compositions, coatings and articles.

There is another need in the art for nitride compositions, coatings and articles made therefrom, and methods of making and using the compositions, coatings and articles.

There is even another need in the art for cubic boron nitride compositions, coatings and articles made therefrom, and methods of making and using the compositions, coatings and articles.

There is still another need in the art for compositions of cubic boron nitride and a nitride, coatings and articles made therefrom, and methods of making and using the compositions, coatings and articles There is yet another need in the art for a cBN tool which combines the hardness and heat conductivity of cBN solids with the toughness of the substrate which is able to withstand high speed machining and interrupted cutting.

There is even still another need in the art for a cBN tool formable into desired geometries.

There is even yet another need in the art for a cBN tool which avoids the limitations due to metal bonding.

These and other needs in the art will become apparent to one of skill in the art upon review of this specification, including the claims and drawings.

SUMMARY OF THE INVENTION

It is an object of the present invention to provide for a composition, coatings and articles made therefrom, and methods of making and using the composition, coating and articles.

It is another object of the present invention to provide for a composition comprising a first phase selected from nitrides, carbides, carbonitrides, borides, sulphides, chalcogenides, and silicides, and a second phase selected from nitrides, carbides, carbonitrides, borides, and silicides, coatings and articles made therefrom, and methods of making and using the composition, coating and articles.

It is even another object of the present invention to provide for a cubic born nitride composition, coatings and articles made therefrom, and methods of making and using the composition, coating and articles.

It is still another object of the present invention to provide for a composition of a first phase of cubic born nitride and a second phase of nitrides, carbides, carbonitrides, borides, sulphides, chalcogenides, and silicides, coatings and articles, especially tools, made therefrom, and methods of making and using the composition, coating and article.

It is yet another object of the present invention to provide for a cBN tool which combines the hardness and heat conductivity of cBN solids with the toughness of the substrate which is able to withstand high speed machining and interrupted cutting.

It is still another object of the present invention to provide for a cBN tool formable into desired geometries.

It is even yet another object of the present invention to provide for a cBN tool which avoids the limitations due to metal bonding.

These and other objects of the present invention will become apparent to those of skill in the art upon review of this specification, including its drawings and claims.

According to one embodiment of the present invention, there is provided a coated article comprising a substrate supporting a coating comprising a first phase selected from nitrides, carbides, carbonitrides, borides, sulphides, chalcogenides, oxides, and silicides, and a second phase selected from nitrides, carbides, carbonitrides, borides, sulphides, chalcogenides, oxides, and silicides. The second phase is continuous, is in contact with the substrate, and is in contact with the first phase.

According to another embodiment of the present invention, there is provided a method of coating a substrate. The method includes forming on the substrate, a first phase comprising at least one of nitrides, carbides, carbonitrides, borides, sulphides, chalcogenides, oxides, and silicides. The method further includes forming on the substrate, a second phase comprising at least one of nitrides, carbides, carbonitrides, borides, oxides, and silisides. The second phase is continuous, is in contact with the first phase, and displaces at least a portion of the first phase from the second phase. In a further embodiment of this embodiment, in step (A) the first phase is formed by electrostatic spray coating, and in step (B) the second phase is formed by chemical vapor infiltration.

According to even another embodiment of the present invention, there is provided a method of shaping a workpiece. The method includes contacting the workpiece with a tool work surface. The work surface comprises a first phase selected from nitrides, carbides, carbonitrides, borides, sulphides, chalcogenides, oxides, and silicides, and a second phase selected from nitrides, carbides, carbonitrides, borides, sulphides, chalcogenides, oxides, and silicides. The second phase is continuous, is in contact with the substrate, and is in contact with the first phase.

According to still another embodiment of the present invention, there is provided a tool comprising a work surface. The work surface comprises a first phase selected from nitrides, carbides, carbonitrides, borides, sulphides, chalcogenides, oxides, and silicides, and a second phase selected from nitrides, carbides, carbonitrides, borides, sulphides, chalcogenides, oxides, and silicides. Furthermore, the second phase is continuous is in contact with the substrate, and is in contact with the first phase.

In further embodiments of any of the above embodiments, the first phase comprises a nitride and the second phase comprises a nitride different that the nitride of the first phase.

In even further embodiments of any of the above embodiments, wherein the first phase comprises cubic boron nitride.

In still further embodiments of any of the above embodiments, the first phase comprises cubic boron nitride, and the second phase comprises titanium nitride.

These and other embodiments of the present invention will become apparent to those of skill in the art upon review of this specification, including its drawings and claims.

BRIEF DESCRIPTION OF THE DRAWINGS

FIG. 3 is an energy dispersive x-ray (EDS) plot comparison of used and unused Ti powder in the feeder, showing very slight variation in the Ti powder composition even after a number of cycles through the powder feeder.

FIG. 4A is an scanning electron microscope ("SEM") photograph of the ESC applied coating of Example 1 showing uniform thickness of about 15 $\mu$m, with FIG. 4B showing the target view area of the SEM.

FIGS. 5A and 5B are SEM photographs showing a magnified side view of the ESC applied coating of Example 1, with respective target view areas of the SEMs shown in FIGS. 5C and 5D.

FIG. 6A is an SEM photograph of a side view of the ESC applied cBN-coated sample of Example 1 showing half scraped and half coated portion of the sample, with FIG. 6B showing the target view area.

FIGS. 7A and 7B are SEM photographs showing variation in the coating thickness that could be seen, as the sample view area is changed from the extreme corner to about one third of the corner and the tool center.

FIG. 8 is an SEM photograph of a typical ESC applied cBN coated tool surface prior to Chemical Vapor Infiltration ("CVI").

FIGS. 18A and 18B are SEM photographs of a top view of the coating of Example 2, providing information on the coverage uniformity of the carbide tool surface.

FIG. 19 is a graph of the test results in Example 2, showing the progression of wear for both the conventional TiN coated tool, and the tool coated according to the present invention, as a function of cutting time.

DETAILED DESCRIPTION OF THE INVENTION

Figure 1:
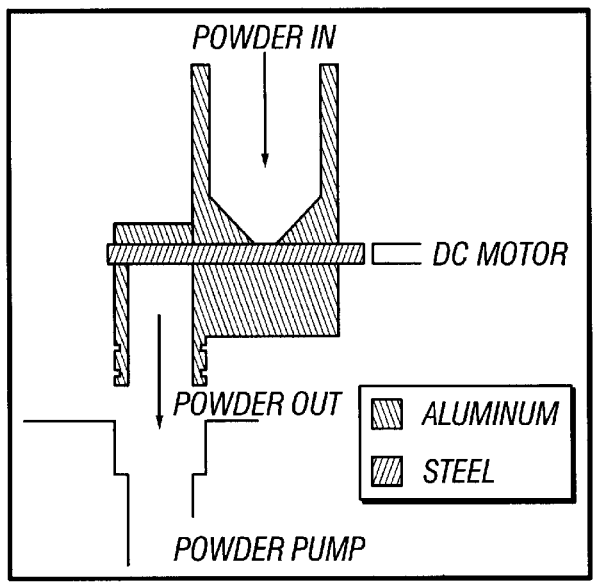
FIG. 1 is a schematic of the powder feeder design utilized with the electronic spray coating ("ESC") equipment of Example 1.

In general terms, the present invention includes a composition of a first phase selected from nitrides, carbides, carbonitrides, borides, even including for example, a boride such as $AlMgB_{14}$ sulphides, chalcogenides, and silicides, present with one or more second phases of nitrides, carbides, carbonitrides, borides, sulphides, chalcogenides, or silicides, and also includes coatings and articles made from such compositions, and even also includes methods of making and using such compositions, coatings and articles.

In the practice of the present invention, the nitrides, carbides, carbonitrides, borides, sulphides, chalcogenides, oxides and silicides utilized in the present invention are nitrides, carbides, carbonitrides, borides, oxides, and silicides of group IVa, Va and VIa transition metals.

In the present composition, the second phase (es) may be "present" by being in a matrix with the first phase; by being infiltrated, dispersed, distributed, or otherwise incorporated into, within or throughout the first phase; by being positioned adjacent the first phase, such as in adjacent layers, or adjacent sections; or by being co-deposited, co-coated, or otherwise co-applied onto a substrate, or by encapsulating the first phase.

Preferably, the second phase is continuous and includes portions in contact with portions of the surface area of the first phase. More preferably, the second phase is continuous and includes a portion in contact with a substantial portion of the surface area of the first phase. Even more preferably, the second phase is continuous and includes portions in contact with substantially all of the surface area of the first phase.

Preferably, the present invention includes a composition comprising cubic boron nitride with which is present one or more of nitrides, carbides, carbonitrides, borides, sulphides, chalcogenides, oxides, and silicides, also includes coatings and articles made from such compositions, and further includes methods of making and using such compositions, coatings and articles.

More preferably, the present invention includes a composition comprising cubic boron nitride with which is present a nitride, suitable example of which includes titanium nitride, and also includes coatings and articles made from such compositions, and further includes methods of making and using such compositions, coatings and articles.

In a preferred embodiment of the present invention, a coating is obtained by utilizing a two step process of first coating a base layer of the first phase selected from one or more of nitrides, carbides, carbonitrides, borides, sulphides, chalcogenides, oxides, and silicides, and then interspersing throughout the base layer, a second phase selected from one or more of nitrides, carbides, carbonitrides, borides, sulphides, chalcogenides, oxides, and silicides to form the coating. In the more preferred embodiment of the present invention, this coating is achieved by first forming a base layer of the first phase utilizing an electrostatic spray coating process, followed by chemical vapor infiltration of the second phase into the first phase.

Electrostatic Spray Coating ("ESC")

Electrostatic spray coating is a well known coating process, in which the powder particles are, generally, electrically insulating in nature and can carry the static charge over a distance of a few tens of centimeters. The electrostatic charge is generated on the powder particles of the required powder, which is fed into the electrostatic spray gun, by applying high voltage to spray gun electrode (typically a few tens of kilo volts—kV) with respect to the electrically grounded objects. The charged powder particles thus generated follow the electric field lines toward the grounded objects and get coated. Since the powder particles follow the field lines emanating from the entire surface of the grounded objects, the spray coating is formed all over the object surface.

In the practice of the present invention, the preferred ESC coating setup will have the following characteristics integrated into the system: (1) efficient mechanism for powder intake and powder delivery, (2) better control over the distance between the gun and the samples, and (3) most importantly, powder recovery components.

Figure 13:
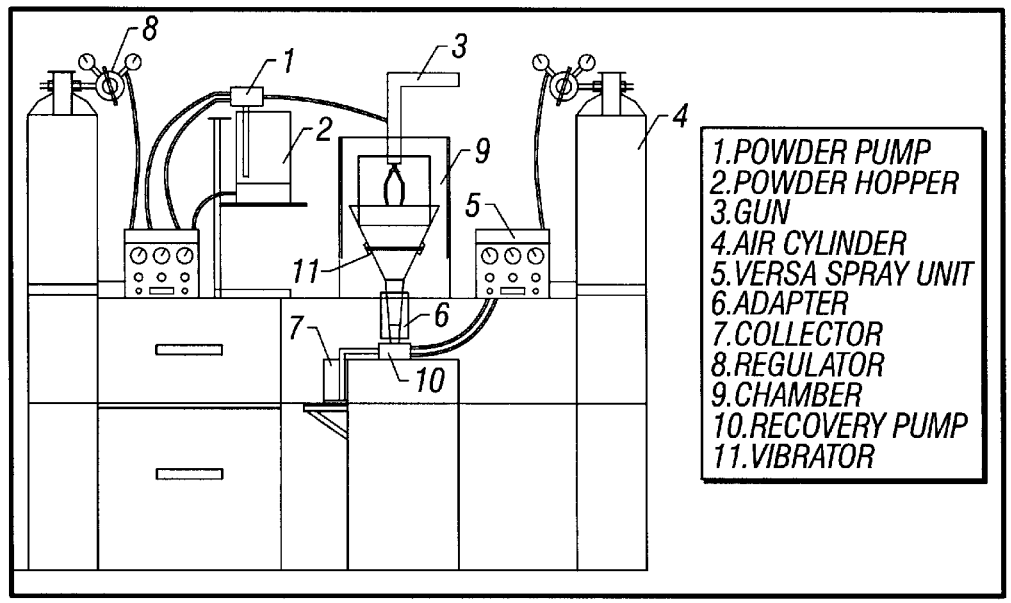
FIG. 13 is a schematic layout of the ESC system utilized in Example 2, showing the control unit, powder hopper, powder feed pump, electrostatic spray gun, powder recovery pump and components, and powder collector.

A non-limiting example of a suitable ESC system is provided in FIG. 13, which is a schematic layout of an ESC system. The important components of the setup of FIG. 13 are: the control unit, powder hopper, powder feed pump, electrostatic spray gun, powder recovery pump and components, and powder collector. The low feed powder pump is mounted on top of the powder hopper, whereas, the electrostatic gun is mounted on top of the coating chamber. The substrates are placed beneath the spray gun at a specified distance from the electrode. A funnel is coupled with the recovery pump to collect the un-used powder. The recovered powder is collected in a powder collector.

For such ESC system as show in FIG. 13, the powder in the hopper is fluidized by passing fluidizing air into the powder hopper.

In the practice of the present invention, the particular application method and equipment utilized will generally determine particle size limitations. Additionally, the desired coating thickness will also influence the particle size utilized. Finally, particle size is selected to provide a desired functional integrity or desired physical properties of the coating. For example, for cBN/TiN coatings made using the equipment of FIG. 13, particle sizes less than 12 microns, preferably less than 2 microns have been shown to be functional. It is believed that larger size particles may be utilized.

The fluidized powder is fed to the electrostatic gun by a low feed powder pump. The pump sucks the powder from the hopper as a result of the suction created by the differential air supply. The charging electrode in the ESC gun is fed a very high potential (~a few tens of kVs). Such a high potential on a pointed electrode causes air to break into cations and electrons. The electrons in this charged cloud drift away from the electrode and ionize the oxygen molecules in the vicinity of the electrode. As powder particles pass through this region, numerous collisions take place between the ions and the particles, and thus, the particle become charged. These charged particles follow the electric lines of force between the electrode and the grounded substrate and are deposited onto the substrate, which is some distance from the charging electrode. The unused powder is collected in a funnel beneath the substrate. By using a number of vibrators and a powder pump, the unused powder is collected in a powder collector. So far, powder collection efficiency is known to be better than 95%.

Chemical Vapor Infiltration ("CVI")

In general, CVI is a process where a porous matrix is filled and then coated using vapor medium. An example of a suitable CVI process is provided in Example 2, FIG. 17.

CVI is very similar to its common counterpart, chemical vapor deposition. The chemistry is the same for both processes, but deposition or growth rates are controlled in a different manner. In CVI, the rate of deposition must be slowed down so that pores can be filled before they are sealed by the growing film, leaving voids in the coating. Proper filling is assured if the rate of diffusion of the reactants within the porous body, either in the gas phase or as surface species, is greater than the rate of growth of the film. Diffusion rates and growth rates are both a function of temperature, so just reducing temperature is not a satisfactory method for developing a CVI process. It is better to control the rate of the reaction chemically so that heat can still be a driving force for the diffusion processes.

EXAMPLES

Example 1

This example demonstrates one embodiment of the present invention, that is, a two step process comprising electrostatic spray coating of cBN, followed by, chemical vapor infiltration.
1. Electrostatic Spray Coating (ESC)
   A. Introduction to ESC:

As a first part of the development, it was necessary to set-up suitable equipment capable of efficiently delivering the cBN powder to the spray gun. It was also essential that the process could be quantified. The meaningful ESC cBN coating formation is incomplete without having an efficient delivery system and quantification. Initially, the ESC process optimization was carried out using liquid medium for the electrostatic spraying of cBN powder. It was assumed that the powder concentration in the liquid medium remains constant. However, it was observed that there is a concentration change during ESC spraying over time which would cause difficulties in the process quantification. As used in this patent specification, "quantification" means correlating the process input with the output, coating thickness being the process output and the time for which the powder is sprayed as the process input.

In order to overcome the difficulty of quantification in liquid ESC spraying technique, the ESC setup was modified with a setup to spray cBN in dry form. The nebulizer section was replaced with a powder pump which was coupled with gas lines. The gas is used as the carrier of the powder and the source of pumping action.

The ESC example runs were carried out using this dry spray method and the dry cBN coating was found to be equally as uniform as that formed with the liquid spray method. It was relatively easier to quantify the process by the use of some kind of powder feeder. In addition to the ease of the quantification operation, it was found that the cBN coatings could be achieved in less time using dry powder ESC than those using liquid spray. This would have the advantage of increasing the throughput in an industrial setup of ESC. The powder feeder would feed the powder to the powder pump at a rate which can be varied by external means. In this way the process could be quantified.

B. Powder feeder:

The prior art powder feed designs were adapted to be suitable for use in the present example. The powder feeder was designed using the feeder screw arrangement. The schematic of the feeder design is shown in FIG. 1. The basic powder feeder comprises an aluminum housing 1, aluminum feeder screw 2, DC motor 3 and DC power supply 4 for motor 3. Aluminum block housing 5 accommodates the powder feeder screw 2 which is coupled to DC motor 3 by a coupler joint. DC motor 3 is energized by DC power supply 4. By varying the input power of motor 3 feeder screw 2 can be rotated at different RPM (revolution per minutes). The feeder chamber is a "V" shaped region of the main housing block where the powder is stored and driven towards the end of the feeder by the motion of the feeder screw.

In the first developed model of the feeder, the trials were carried out using Ti powder, which was chosen for the examples with the feeder since it was available readily and in order not to contaminate costly cBN powder. Also, Ti can be used as the impurity in the ESC cBN coating which can play the role of binder in the later stage. The feeder operation was found to be successful with Ti powder, with the feed rate successfully varied by varying the voltage applied to the DC motor.

A typical measurement of the feed rate observed in the case of Ti is as shown in the following FIG. 2.

Powder Feed Quantification: Powder Collected as a function of time with minimum potentiometer position (minimum motor rpm) and with the vibrator attached to powder feeder Powder: Ti metal (1–3 $\mu$m particle size, includes powder with some large powder particulates)

Figure 2:
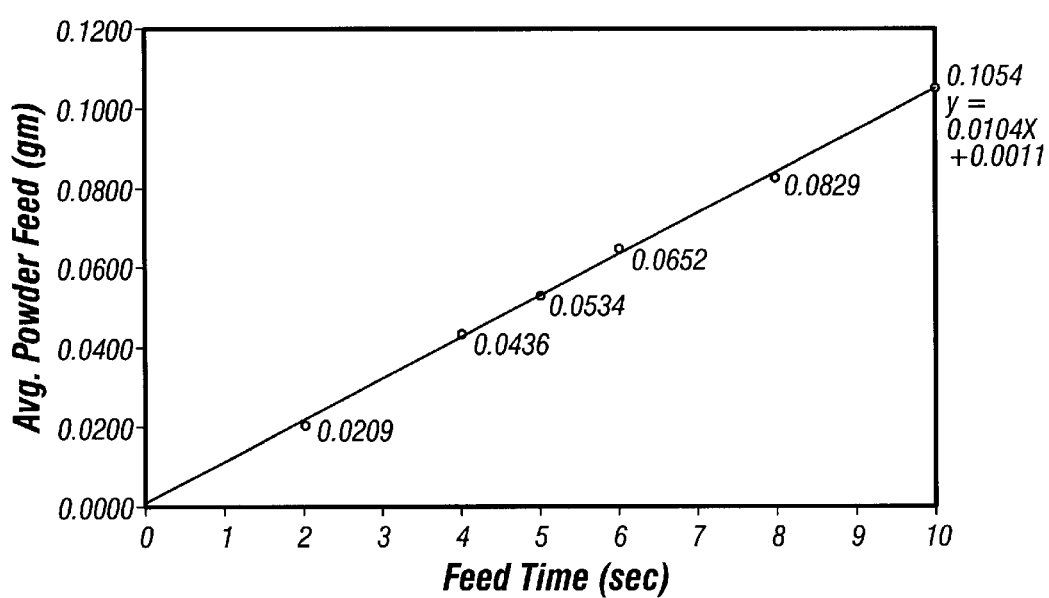
FIG. 2 is a plot of the output of the powder feeder of FIG. 1, showing the linear variation of average Ti powder (grams) as a function of time (seconds).

FIG. 2 shows output of the powder feeder showing the linear feed rate for Ti powder.

The feeder was mounted on the powder pump using a cylindrical tube. It was found that during the ESC process, due to the suction in the powder pump, all the powder in the feeder reservoir is pulled in the pump without the motion of the feed screw. This, in turn, affects the operation of the feeder. In order to avoid this situation, a couple of holes were drilled in the cylindrical tube connecting the feeder and powder pump. It was then possible to use the screw feeder in conjunction with the powder pump to carry out ESC of Ti powder in a controlled manner.

During the feeder operation, it is possible that due to the motion of the feeder screw, the Ti powder being used in the feeder could be contaminated. To check this possibility, the Ti powder used in the feeder for a number of feeding operations was tested for chemical contamination with the help of energy dispersive x-ray analysis (EDS). The results are shown in FIG. 3, showing very slight variation in the Ti powder composition even after using for number of times through the powder feeder.

After the success of the feeder for feeding the Ti powder, the experiments were carried out to see the operation with cBN powder. The cBN powder could be used in the feeder, however, the feeder could work for a few seconds and then the feeder cavity and the screw pitch would choke with cBN powder resulting in no powder flow out of the feeder.

It was seen that if the aluminum housing was vibrated by some means, the blocking events can be reduced. To take into account these factors and to improve upon the feeding the cBN powder for quantification, a new powder feeder was designed with changes as follows: very finely finished feed cavity; smaller length of the feed cavity; square pitch of the feed screw; and a small hand-held vibratory unit mounted on the feeder body. The body of the feeder was fabricated using aluminum block onto which was mounted the DC motor. The powder reservoir was funnel-shaped which would make the powder flow easier.

After fabrication of the modified powder feeder, it was tested for cBN powder coating. The flow obtained for cBN powder was better than the previous design, with a reduction in the clogging tendency of the cBN powder. The feed rate was varying depending upon the clogging action. The basic cause for clogging action is the tendency for moisture adsorption on the cBN powder particles and, thus, to form clumps or agglomerates. It was seen that if the powder is dried using an IR lamp before using in the feeder, the powder feeding is more continuous in the first round. With continuous use of the feeder the powder starts to clog up in the successive rounds of feeding, making quantification difficult.

C. ESC Coating Uniformity:

Due to the technical difficulty of quantification of powder during the ESC spraying, the ESC dry coats were deposited and example runs continued with a strategy of using a constant amount of powder charge per run.

The powder is poured into a glass funnel attached to the powder pump. With a suction generated due to the air flow in the powder pump, powder is sucked in the pump chamber wherein it is fluidized and carried over into the ESC spray gun by the air flow. The fluidizing action causes the cBN powder agglomerates/chunks to break into smaller individual particles. These particles, with accompanying air flow, travel along the electric field lines onto the tool samples kept at a fixed distance from the ESC spray gun.

The coats prepared under various conditions were studied to observe the variation and uniformity of the tool before chemical vapor infiltration processing. The details of this study are as follows:

D. Microscopic observation of the coating:

FIG. 4A is an SEM photograph showing the uniform thickness of about 15 $\mu$m, with FIG. 4B showing the target view area of the SEM. The sample preparation was carried out as follows. The ESC coated cBN layer was scraped by a sharp edge blade, by taking the support of the tool's side angle. The samples were then coated with a thin gold layer in order to avoid the charging in the scanning electron microscope.

The magnified side view of the coating, as seen in FIGS. 5A and 5B, with respective target view area of the SEMs shown in FIGS. 5C and 5D, reveals the ESC cBN coating is more than 10 $\mu$m thick at some points in the coating. The coating is continuous right from the tool surface. The sections in FIGS. 5C and 5D are the magnified views of coated tool edges after scraping with a blade edge. It is certainly greater than 3 $\mu$m as observed in the sample after CVI.

FIG. 6A is an SEM photograph for the side view of the cBN-coated sample showing half scraped and half coated portion of the sample, with FIG. 6B showing the target view area. The cBN coating is continuous from the top of the tool surface to the side of the tool. The morphology of the cBN coating, as seen in the figure, shows the bumps of the cBN particles with intermittent gaps.

FIGS. 7A and 7B are SEM photographs showing the variation in the coating thickness that could be seen, as the sample view area is changed from the extreme corner to about one third of the corner and the tool center. There is a variation in the coating thickness going down. As we go toward the center of the tool surface, as depicted in FIG. 7B, variation in coating thickness continues and coating thins down, leading to the presence of more globular chunks of cBN particles instead of a continuous cBN layer.

A closer look at the microscopic observations on ESC cBN coated surface of flat tool insert shows the thickness variation from one edge to the other; thickness being higher in the vicinity of the tool edge than in the central region of the tool surface. The variation in the coating is on the thickness level of the coating as well as in the discontinuity of the coating layer. The thickness variation seems to be the outcome of the electric field distribution on the tool surface.

Experimentation was carried out to reduce the thickness variation on the ESC coated tool insert. Within the experimental errors, the variation of operating parameters could not alter the thickness variation, though application desired continuous coating were deposited successful on flat and contoured surfaces.

2. Chemical Vapor Infiltration (CVI) Processing

The ESC cBN coating formed on commercially available flat tool inserts (for discussion purposes, three types of commercially available inserts will be referred to as "Type-1, 2 and 3" inserts, and are described below) were coated with the dry spray method. In an effort to improve the adhesion of the ESC cBN coating with the insert, it was decided to carry out TiN chemical vapor infiltration of ESC coated cBN layer on flat inserts to marry the cBN coating with the insert and to improve the adhesion of ESC coated cBN with the insert.

The total gas flow of 52.9 l/m was divided as follows: 73% $H_2$, 25% $N_2$, and 2% $TiCl_4$, at 985° C., 150 torr, for 120 minutes.

FIG. 8 is an SEM photograph of a typical ESC cBN coated tool surface.

Figure 9:
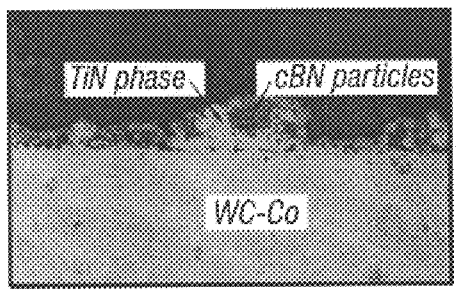
FIG. 9 is an SEM photograph of a coating of one embodiment of the present invention (i.e. an ESC applied cBN coating subjected to TiN CVI), revealing intimate contact between cBN particles (black portion of the coating) and TiN (white part of the coating).

Example runs of CVI with TiN were carried out on an electrostatically cBN coated WC-Co tool, prepared as described above. Analysis revealed the ESC coated cBN layer to be well infiltrated by the TiN chemical vapor infiltration. It also showed that the cBN particles could be held together and had fairly good contact with the substrate. FIG. 9 is an SEM photograph showing a typical cross-sectional view for TiN CVI.

As shown in FIG. 9 there is intimate contact between cBN particles (black portion of the coating) and the TiN (white part of the coating).

Figure 10:
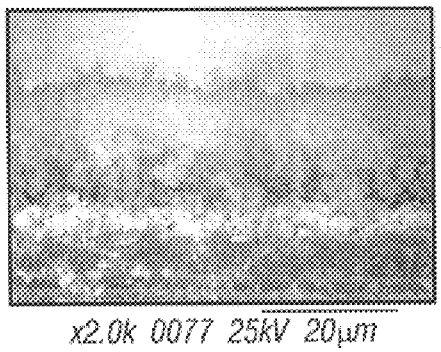
FIG. 10 is an SEM photograph of an ESC applied cBN layer on a commercially available TiC/TaC/Co (0%/0.5%/6%) flat tool insert, showing a uniform cBN coating with a typical thickness of ~20 $\mu$m.

The cBN coatings formed successfully on the Type-1 commercially available flat tool inserts by the ESC process described above were found to be uniform under optical microscope. In order to investigate the different possibilities leading to such a variation in TiN—cBN composite coating, a study was undertaken. FIG. 10 is an SEM photograph of the ESC coated cBN layer on a Type-1 commercially available flat tool insert, showing a uniform cBN coating with a typical thickness of ~20 $\mu$m. The coating seems to be thicker than the one observed in TiN CVI processed sample.

Figure 11:
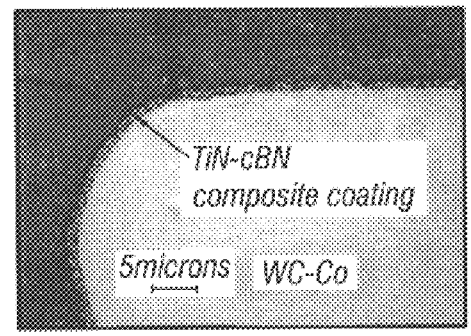
FIGS. 11 and 12 are SEM photographs of an ESC/CVI applied coating of Example 2, in which the white and the black portions represent TiN and cBN, respectively.
Figure 12:
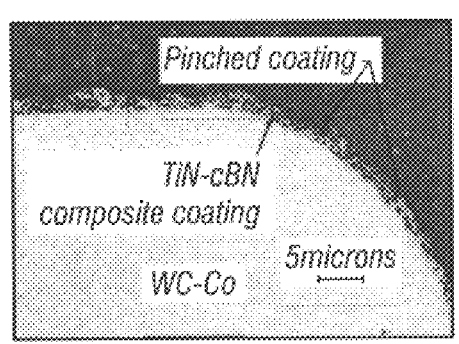

After looking into these results, subsequent example runs utilized reduced gas flows during CVI processing. Such reduced gas flows provided a uniform TiN CVI composite coating. FIGS. 11 and 12 are SEM photographs in which the white and the black portions of the composite coating represent TiN and cBN, respectively. These results were very encouraging.

As shown in FIGS. 11 and 12, the prominent feature of the coating is that after CVI the coating thickness is reduced down to about 2.5–3 µm. The starting thickness of the ESC cBN coating was about 20 µm (see, FIG. 10).

While not wishing to be limited by theory, the inventors believe the possibility lies in the powder particle lost during initial pumping of the CVI reactor or gas flow dynamics in the chamber. The important behavior of the ESC-CVI composite coating can be observed from the overall uniform coating of cBN—TiN matrix along the edge of the tool surface. Though there is a uniformity of the two phases, TiN phase (white portion of the coating) seems to dominate certain areas. Also, the cBN—TiN composite coating seems to be very thin at certain points of the coating (see, FIG. 12).

This example shows that with this embodiment of the present invention, that the particles are well distributed in a visible TiN matrix at a reduced flow rate of the reacting gases in a CVI reactor. The composite coating of cBN—TiN was found to be thicker near the edges of the tool than on the face of the tool—which is consistent with the microscopic observations. Furthermore, cBN was found to be present continuously across the surface of the tool. Finally, adhesion of the cBN—TiN composite coating was found to be excellent.

Example 2

This example demonstrates another embodiment of the present invention, that is, a two step process comprising electrostatic spray coating of cBN, followed by, chemical vapor infiltration.

1. Electrostatic Spray Coating (ESC)

ESC was conducted essentially as described above in Example 1, except as noted herein.

Without wishing to be limited by theory, the inventors believe that continuous uninterrupted powder feeding is one of the most important parts of the ESC setup. Some of the inherent difficulties involved in this process are:

particle clumping/chunk formation;

inefficient delivery of cBN powder from the container to the spray gun, and process quantification.

The first difficulty in the powder delivery is that the as-received powder contains particle clumps/chunks. If powder containing chunks is used for ESC spray coating, the resulting coating also contains such chunks, resulting in a non-uniform coating. While it is believed that a number of suitable methods exist to either break these chunks apart or eliminate them by appropriate means during spraying, such as grinding or sieving methods, pulverization was utilized in this Example.

Analysis revealed the original particle size of the cBN powder sample was 0–2 µm with powder chunk sizes in the range of 40 to 60 µm. The smallest size pulverizer was used for the processing. Following pulverization, the powder had following properties:

no agglomerates were noticed;

the average particle size was found to be 1 µm;

the feed rate was estimated to be 3 PPH (with a pressure of 105 psi and ambient temperature); and the volume of the powder was found to increase by approximately 50%.

FIG. 13 is a schematic layout of the ESC system utilized in this Example. The important components of the setup of FIG. 13 are: the control unit, powder hopper, powder feed pump, electrostatic spray gun, powder recovery pump and components, and powder collector. The low feed powder pump is mounted on top of the powder hopper, whereas, the electrostatic gun is mounted on top of the coating chamber. The substrates are placed beneath the spray gun at a specified distance from the electrode. A funnel is coupled with the recovery pump to collect the un-used powder. The recovered powder is collected in a powder collector.

In order to examine the test conditions and the overall setup performance, computational fluid dynamics analysis using finite volume FLUENT modeling of the particle flow pattern has been initiated. Details of the FLUENT modeling and some of the preliminary results are discussed below. The modeling results obtained from FLUENT analysis are being used to establish the ESC experimental parameters. In turn, the outcome of the modified experimental parameter matrix will be used to cross-check the FLUENT modeling boundary conditions.

Figure 14:
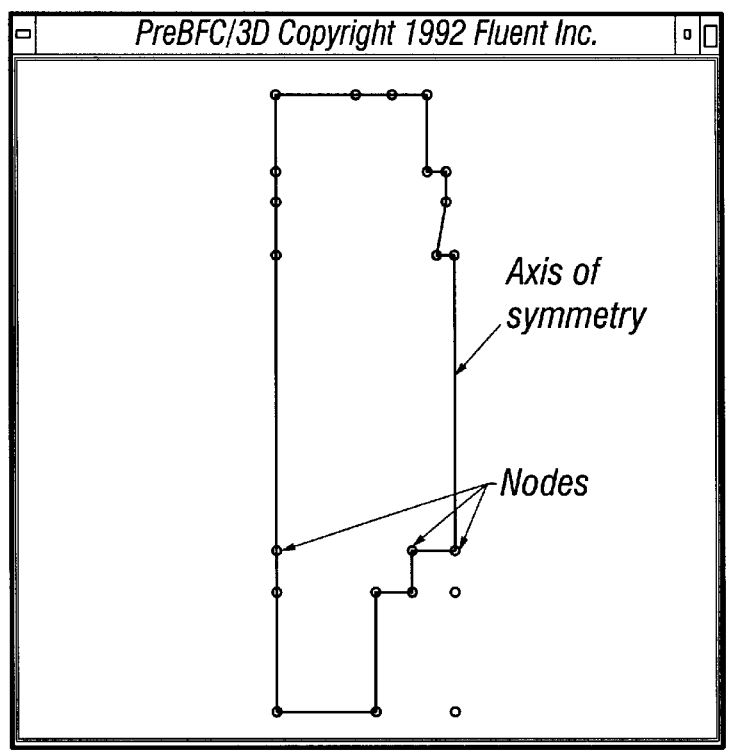
FIG. 14 is a plot showing the geometry of the setup for Example 2.

2. Fluent Analysis:

In the present Example, commercially available computational fluid dynamics software, FLUENT, was utilized to analyze the flow patterns of the powder particles. The analysis of the powder flow pattern is carried out in a region of interest which can be selected by setting up the appropriate boundary conditions. The region of interest in present case is the space between the spray gun electrode and the substrate. The geometry of the ESC setup between the electrode and the substrate is considered in the analysis. Due to the axial symmetry of the setup geometry, only half of the setup has been taken into consideration for the analysis. FIG. 14 is a plot showing the geometry of the setup generated using the preBFC part of FLUENT.

Figure 15:
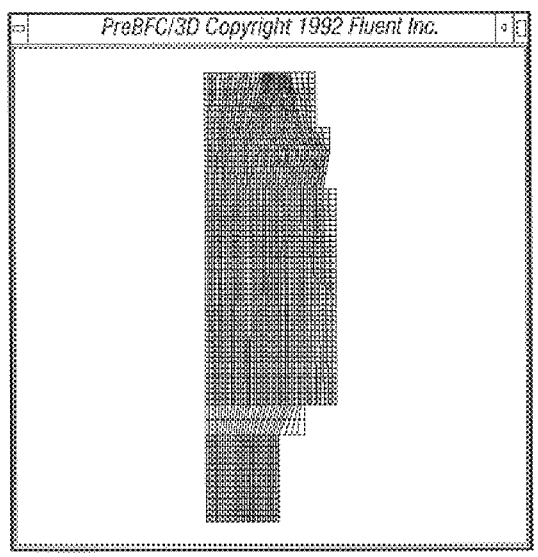
FIG. 15 is a plot showing the generated grid for analyzing the flow of particles at each grid point in the region of interest.

Using the geometry thus defined, grids are generated between the node points (encircled points in FIG. 14) of the given geometry. FIG. 15 shows the generated grid, which is essential for analyzing the flow of particles at each grid point in the region of interest.

Figure 16:
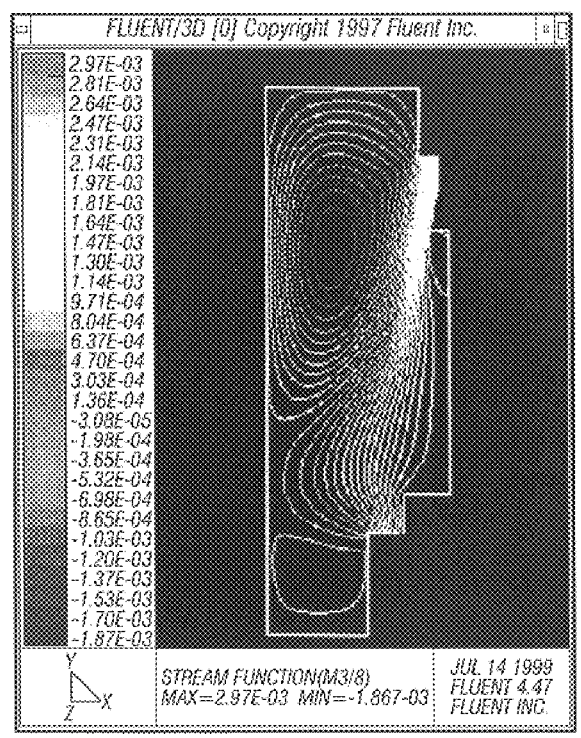
FIG. 16 is a plot showing the flow patterns of particles after 1000 iterations.

The boundary conditions and assumptions used in the present example are: (1) the ESC setup boundaries are considered as the wall boundaries and the symmetry line; (2) the inlet velocity conditions assume the downward velocity of 1 m/s and the upward velocity from the bottom of 0.1 m/s; and (3) the k-epsilon model was used. Once the initial conditions are specified, the grid is iterated a number of times and residuals for the velocity and pressure are monitored. The higher the number of iterations, the better is the accuracy. FIG. 16 shows the flow patterns of particles after 1000 iterations.

The velocities of the particles, as can been seen from FIG. 16, are different at different points in the flow field and are denoted by different colors; blue representing a lower particle velocity, whereas, red signifies a higher velocity.

As can be seen from the flow pattern in FIG. 16, particles flow at different velocities (shown by different colors) and, as expected, move from the tip of the electrode to the substrate. FIG. 16 also brings out the effect of differing flows which interact with each other. Turbulence is also created in the flow pattern of the particles. It is shown by the elliptical flow pattern in FIG. 16.

Once the flow fields are generated after a sufficient number of iterations, the particles can be tracked from the tip of the electrode to the substrate using the (x, y) coordinates and the (u, v) velocity vectors of each node point of the grid. This is done using any suitable programming language ("C" for example), and standard numerical techniques.

3. Chemical Vapor Infiltration (CVI) Processing

CVI was carried out as discussed above for Example 1, except as noted herein.

Figure 17:
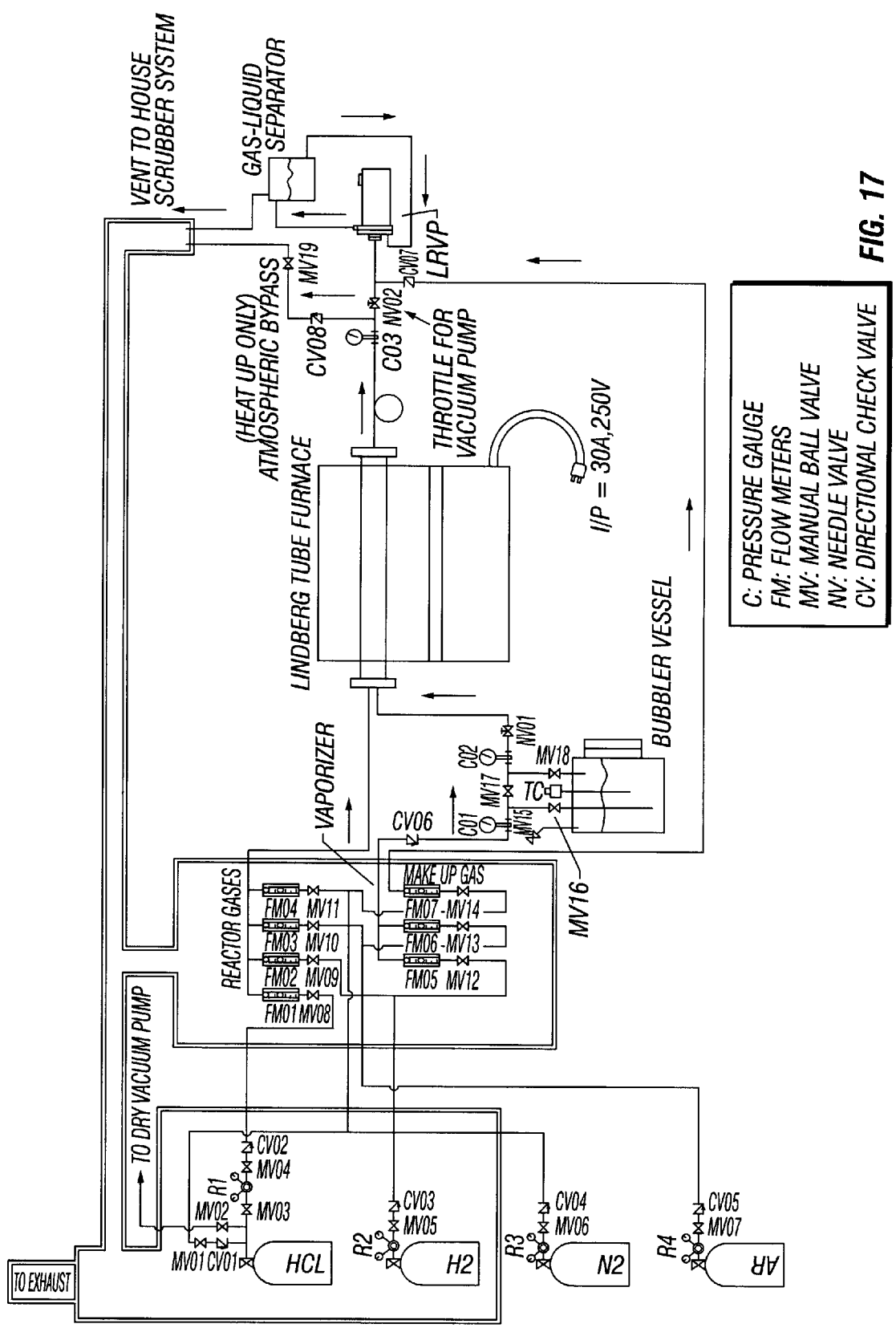
FIG. 17 is a schematic of the laboratory-scale CVI system utilized in Example 2.

FIG. 17 is a schematic of the laboratory-scale CVI system utilized in the present Example.

The total gas flow of 20.86 l/m was conducted in three segment as follows: Segment 1–70.1% $H_2$, 24% $N_2$, 2.1% $TiCl_4$ and 3.8% HCl, at 985° C., 150 torr, for 180 minutes; Segment 2–71.1% $H_2$,24.3% $N_2$, 2.2% $TiCl_4$ and 2.4% HCl, at 985° C., 150 torr, for 120 minutes; and Segment 3–73% $H_2$,25% $N_2$, and 2% $TiCl_4$, at 985° C., 150 torr, for 60 minutes.

4. Results of ESC cBN Coating:

The ESC cBN coating runs of this Example were conducted with a strategy of using a constant amount of powder charge per experiment because of the difficulty in quantifying the amount of powder used for a given coating operation. In this Example, the powder is poured into a plastic tube which is coupled to the powder pump. Due to the vacuum generated by the air flow in the powder pump, powder particles are sucked into the pump chamber, wherein it is fluidized with the fluidizing air and carried into the ESC spray gun by the air flow. The fluidizing action causes the cBN powder agglomerates/chunks to break into smaller particles. The coatings prepared under various conditions were studied to check the variation/uniformity of the tool coating before chemical vapor infiltration processing. Microscopic observation of the ESC cBN coating on WC-Co tools was done by SEM to study the surface morphology of the coating. SEM remains the main tool for studying ESC coatings since the bare coating is so fragile that, without further processing, such as CVI, it can be damaged by improper handling.

A top view of a coating, as seen in FIGS. 18A and 18B, gives information on the coverage uniformity of the carbide tool surface. The carbide substrate was ESC coated with cBN using typical coating parameters and conditions. The samples were then coated with a thin gold layer to avoid film charging in the scanning electron microscope.

5. Laboratory Testing of Composite-coated Tools

The performance of the cBN—TiN composite coating as formed in this Example was tested under a variety of different conditions for different batches of coated tools. The amount of cBN in the composite coating was varied to observe the effect on machining. Testing revealed that tool wear and wear life of tools coated according to the present invention are reduced and enhanced, respectively by a factor of three to four compared to standard TiN-coated cutting tools. Such improvement in tool life is extremely important and impressive to tooling and manufacturing industries.

For the machine testing of composite-coated tools, several different grades of WC-Co tools, which act as the substrate, have been identified. These tools, from Valenite, Inc., are referred to herein as Type-1, Type 2 and Type 3 and are described below, with physical characteristics provided in the following table.

For example, Type-1 is a general grade tool, primarily used for machining cast iron, non-ferrous alloys, and plastics which require tooling operations such as roughing, semi-finishing, threading, and grooving. This grade of tool has excellent wear resistance characteristics.

The second tool, Type-2, is a roughing grade tool and is used for machining alloy steel and stainless steel. This grade of tool has excellent toughness and is used for operations such as roughing, interrupted cuttings, threading and, grooving. Because of its toughness properties, it is used to machine hard materials such as stainless steel and other alloy steels which exhibit toughness.

The final tool, Type-3, is a semi-finishing grade tool and is used for operations from light roughing to finishing. Its primary application is threading and grooving.

The machining tests were conducted with a CNC lathe on a 4340 steel workpiece with a Rockwell C hardness number of 28–34, under dry conditions (no coolant or lubricant). Other machining parameters were held constant during the tests. These parameters were: surface feed rate=600 surface ft/m, tool feed rate=0.01 inches per/revolution, and depth of cut (DOC)=0.08 inches. The tool geometry was CNGA432 (ISO standard).

For comparison of the machining results with standard tool performance, tool life end point was defined as the time required to generate 0.015" of flank/nose wear, a 0.005" crater, or chipping of the cutting edge.

The results for cBN—TiN composite coatings were compared to tools with a similar substrate coated with TiN, which is a conventional coated cutting tool. The conventional coated cutting tool was used as a reference.

FIG. 19 is a graph of the test results, showing the progression of wear for both the conventional TiN coated tool, and the tool coated according to the present invention, as a function of cutting time.

The testing was performed on two different edges of a cBN—TiN coated sample with the cutting conditions as described above. The tool edge of the cBN—TiN coated sample wore out in about 9.2 minutes of cutting time, while the reference tool, coated with TiN, only survived about 3.4 minutes. Thus, the tool life of the cBN—TiN composite coated tools was found to be approximately three times better that of the TiN coated reference tool.

Adhesion testing was performed on the cBN—TiN composite coated tools of both Example 1 and 2. The tools of Example 2 show marked improvement in adhesion compared to the Example 1 samples.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present

| Type | TiC (wt %) | TaC (wt %) | Co (wt %) | Hardness (Rockwell A) | Density (g/cc) | Magnetic Saturation (emu/g) | HC oersteds |
|---|---|---|---|---|---|---|---|
| 1 | 0 | 0.5 | 6.0 | 92.0 | 14.9 | 145 | 226 |
| 2 | 8.0 | 11.5 | 8.5 | 91.5 | 12.5 | 145 | 155 |
| 3 | 10.0 | 2.0 | 7.0 | 92.1 | 12.3 | 143 | 125–175 |

We claim:

1. A method of coating a substrate comprising:
   (A) depositing solid particles on the substrate to form a base layer, wherein said particles are in contact with the substrate, and wherein said particles comprise at least one of the group consisting of nitrides, carbides, carbonitrides, borides, oxides, sulphides and silicides; wherein said solid particles are deposited as a dry phase, and
   (B) infiltrating said base layer with a gas to form a continuous composite layer on the substrate, wherein said continuous composite layer comprises at least one of the group consisting of nitrids, carbides, carbonitrides, borides, sulphides, chalcogenides, oxides, and silicides, wherein said gas is in contact with particles of the base layer, and wherein said gas is in contact with portions of the substrate at regions between particles of the base layer.

2. The method of claim 1, wherein the particles comprise a nitride and the continuous composite layer comprises a nitride different than the nitride of the particles.

3. The method of claim 1, wherein in step (A) the base layer is formed by electrostatic spray coating, and in step (B) the continuous composite layer is formed by chemical vapor infiltration.

4. The method of claim 3, wherein the particles comprise cubic boron nitride.

5. The method of claim 3, wherein the particles comprise cubic boron nitride, and the continuous composite layer comprises titanium nitride.

6. A method of shaping a workpiece, comprising contacting the workpiece with a tool work surface, wherein the work surface comprises a substrate having a continuous composite layer formed thereon, wherein said composite layer is formed by depositing solid particles on the substrate to form a base layer, and infiltrating said base layer with a gas, wherein said particles comprise at least one of the group consisting of nitrides, carbides, carbonitrides, borides, sulphides, chalcogenides, oxides, and silicides, wherein said solid particles are deposited as a dry phase, wherein said continuous composite layer comprises at least one of the group consisting of nitrides, carbides, carbonitrides, borides, sulphides, chalcogenides, oxides, and silicides, wherein said gas is in contact with particles of the base layer, and wherein said gas is in contact with portions of the substrate at regions between particles of the base layer.

7. The method of claim 6, wherein the particles comprise a nitride and the continuous composite layer comprises a nitride different than the nitride of the particles.

8. The method of claim 6, wherein the particles comprise cubic boron nitride.

9. The method of claim 6, wherein the particles comprise cubic boron nitride, and the continuous composite layer comprises titanium nitride.

10. The method of claim 6 wherein said depositing is by electrostatic spray coating and said infiltrating is by chemical vapor infiltration.

11. A method of coating a substrate comprising:
    (A) depositing solid particles on the substrate to form a base layer, wherein said particles are in contact with the substrate, and wherein said particles comprise at least one of the group consisting of nitrides, carbides, carbonitrides, borides, oxides, sulphides, and silicides; wherein said solid particles are deposited as a dry phase, and
    (B) infiltrating said base layer with a gas to form a continuous composite layer on the substrate, wherein said continuous composite layer comprises at least one of the group consisting of nitrides, carbides, carbonitrides, borides, sulphides, chalcogenides, oxides, and silicides.

12. The method of claim 11 wherein said gas is in contact with particles of the base layer, and wherein said gas is in contact with portions of the substrate at regions between particles of the base layer.

13. A method of shaping a workpiece, comprising contacting the workpiece with a tool work surface, wherein the work surface comprises a substrate having a continuous composite layer formed thereon, wherein said composite layer is formed by depositing solid particles on the substrate to form a base layer, and infiltrating said base layer with a gas, wherein said particles comprise at least one of the group consisting of nitrides, carbides, carbonitrides, borides, sulphides, chalcogenides, oxides, and silicides, wherein said solid particles are deposited as a dry phase, and wherein said continuous composite layer comprises at least one of the group consisting of nitrides, carbides carbonitrides, borides, sulphides, chalcogenides, oxides, and silicides.

14. The method of claim 13 wherein said gas is in contact with particles of the base layer, and wherein said gas is in contact with portions of the substrate at regions between particles of the base layer.

* * * * *